(12) United States Patent
Pham et al.

(10) Patent No.: US 6,465,835 B1
(45) Date of Patent: Oct. 15, 2002

(54) CHARGE GAIN/CHARGE LOSS JUNCTION LEAKAGE PREVENTION FOR FLASH TECHNOLOGY BY USING DOUBLE ISOLATION/CAPPING LAYER BETWEEN LIGHTLY DOPED DRAIN AND GATE

(75) Inventors: Tuan Duc Pham, Santa Clara; Mark T. Ramsbey, Sunnyvale; Sameer S. Haddad, San Jose; Angela T. Hui, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/487,964

(22) Filed: Jan. 18, 2000

Related U.S. Application Data

(60) Provisional application No. 60/156,462, filed on Sep. 27, 1999.

(51) Int. Cl.[7] .............................................. H01L 29/788
(52) U.S. Cl. ........................ 257/315; 257/316; 257/320; 438/257; 438/258
(58) Field of Search ................................. 257/315, 316, 257/319, 320, 321, 322; 438/258, 266, 257

(56) References Cited

U.S. PATENT DOCUMENTS

| | | | | |
|---|---|---|---|---|
| 5,614,748 A | * | 3/1997 | Nakajima et al. ............ | 257/316 |
| 5,656,522 A | * | 8/1997 | Komori et al. ............. | 438/258 |
| 5,793,673 A | * | 8/1998 | Pio et al. ................ | 365/185.01 |
| 6,248,627 B1 | * | 6/2001 | Pham et al. ................ | 438/257 |

* cited by examiner

Primary Examiner—Trung Dang
(74) Attorney, Agent, or Firm—LaRiviere, Grubman & Payne, LLP

(57) ABSTRACT

An improved flash memory device having core stacks and periphery stacks which are protected by first and second thin side walls, side spacers over the side walls, and an HTO layer over the stacks, and side spacer. The flash memory device has an intermetallic dielectric layer placed over the HTO layer. A tungsten plug is placed in the intermetallic dielectric layer to provide an electrical connection to the drain of the flash memory device. The additional first and second side walls reduce current leakage between core stacks and the tungsten plug and help to protect the stacks during fabrication.

10 Claims, 3 Drawing Sheets

CHARGE GAIN/CHARGE LOSS JUNCTION LEAKAGE PREVENTION FOR FLASH TECHNOLOGY BY USING DOUBLE ISOLATION/CAPPING LAYER BETWEEN LIGHTLY DOPED DRAIN AND GATE

RELATED APPLICATION

This application claims priority from and is related to co-pending Provisional Patent Application Serial No. 60/156,462, entitled "Charge Gain/Charge Loss Junction Leakage Prevention for Flash Technology by Using Double Isolation/Capping Between Lightly Doped Drain and Gate," filed Sep. 27, 1999, by the same applicants.

FIELD OF THE INVENTION

The present invention relates to nonvolatile memory devices. Even more particularly, the present invention relates to flash memory utilizing periphery and core stacks.

BACKGROUND OF THE INVENTION

Memory devices such as flash memory or electrically erasable programmable read only memory (EEPROM) are known. U.S. Pat. No. 5,656,513 to Wang et al. and U.S. Pat. No. 5,693,972 to Liu disclose prior art flash memory devices. FIG. 1 is a cross sectional view of an incomplete flash memory structure 10, known in the prior art. Shown as parts of the flash memory structure 10 are a substrate 12, a plurality of core stacks 16 mounted on the substrate 12 in a row forming a word line, and a periphery stack 14 associated with the word line of the core stacks mounted on the substrate 12 spaced apart from the core stacks 16.

A first oxide layer 18 forms a first layer of the periphery stack 14 and the core stacks 16, where the first oxide layer 18 has a first side adjacent to the substrate 12 and a second side opposite from the first side. The first oxide layer 18 for the periphery stack 14 is a gate oxide layer, and the first oxide layer 18 for the plurality of core stacks 16 are tunnel oxide layers. A first polysilicon layer 20 forms a second layer of the core stacks 16, where the first polysilicon layer 20 has a first side adjacent to the second side of the first oxide layer 18 and a second side opposite from the first side of the first polysilicon layer 20. An interpoly dielectric layer 22 forms a third layer of the core stacks 16, where the interpoly dielectric layer 22 has a first side adjacent to the second side of the first polysilicon layer 20 and a second side opposite from the first side of the interpoly dielectric layer 22. A second polysilicon layer 24 forms a second layer of the periphery stack 14 and a fourth layer of the core stacks 16. A silicide layer 26 forms a third layer for the periphery stack 14 and a fifth layer for the core stacks 16. A third polysilicon layer 28 forms a fourth layer of the periphery stack 14 and a sixth layer of the core stacks 16. An antireflective coating (ARC) 29 forms a fifth layer of the periphery stack 14 and a seventh layer of the core stacks 16.

A protective oxide layer 31 is placed over the periphery stack 14, the core stacks 16 and the uncovered Surface of the substrate 12, as shown in FIG. 2. A first high temperature oxidation oxide (HTO) layer 32 is placed over the protective oxide layer 31. A first resist mask 34 is placed over parts of the first HTO layer 32 to cover the periphery stack 14 and parts of the core stacks 16 and the drain area.

The parts of the first HTO layer 32 not covered by the first resist mask 34 are etched partially away to create self aligned source spacers 36, as shown in FIG. 3. The flash memory structure 10 is subjected to a deep source implant to form deep source regions 37 for the core stacks in the substrate 12. The first resist mask 34 is then stripped away and a second HTO layer 39 is placed over the first HTO layer 32, self aligned source spacers 36, and the uncovered parts of the core stacks 16 and substrate 12 surface, as shown in FIG. 4.

The second HTO layer 39 is etched away to form source/drain spacers 40, as shown in FIG. 5. The flash memory structure is subjected to a shallow dopant implant to create shallow more highly concentrated drain regions 42 and source regions 43. A third HTO layer 45 is placed over the self aligned source and source/drain spacers 36, 40, and the uncovered parts of the core stacks 16, periphery stack 14 and substrate 12 surface. An intermetallic dielectric layer (IDL) 46 is placed over the third HTO layer 45. A trench is etched into the intermetallic dielectric layer (IDL) 46 and is filled to create a tungsten plug 48 electrically connected to a drain region 42 of a core stack 16.

Problems in the manufacture of flash memory according to the above mentioned process may occur, because etching after the core stacks 16 have been formed may damage the core stacks 16. In addition, process induced charging, caused by processes such as plasma deposition, etching, and chemical mechanical polishing, creates ions which may damage the core stacks 16 by way of trapped charges moving between the tungsten plug 48 and the core stacks through the source/drain spacers 40.

BRIEF SUMMARY OF THE INVENTION

Accordingly, the present invention involves producing a flash memory device on a substrate by: forming a plurality of core stacks on the substrate; forming at least one periphery stack on the substrate; forming an oxide layer on the core stacks the periphery stack and the substrate; applying a protective layer over the oxide layer, etching back the oxide layer and protective layer to form side walls around the periphery and core stacks, applying a first HTO layer over the side walls, etching back the first HTO layer to form self aligned source spacers doping the uncovered substrate, applying a second HTO layer, etching back the first and second HTO layers to form source/drain spacers, and doping the uncovered substrate, and then applying an HTO layer over the spacers, periphery stack, core stacks and substrate.

Advantages of the present invention include, but are not limited to, providing a flash memory device with reduced damage to the core stacks and reduced current leakage between the plugs and the stacks. Other features of the present invention are disclosed or apparent in the section entitled: "DETAILED DESCRIPTION OF THE INVENTION."

BRIEF DESCRIPTION OF THE DRAWING

For a fuller understanding of the present invention, reference is made to the accompanying Drawing. Reference numbers refer to the same or equivalent parts of the present invention throughout the several figures of the Drawing.

DETAILED DESCRIPTION OF THE INVENTION AND BEST MODE OF THE INVENTION

Figure 1:
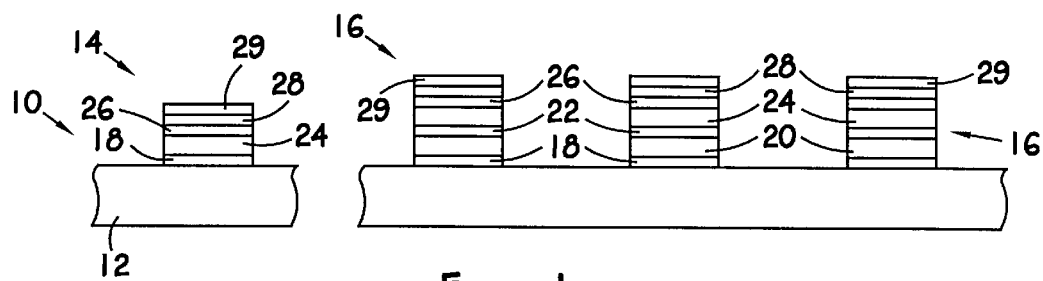
FIG. 1 is a cross sectional view of an incomplete flash memory structure used in the prior art.
Figure 2:
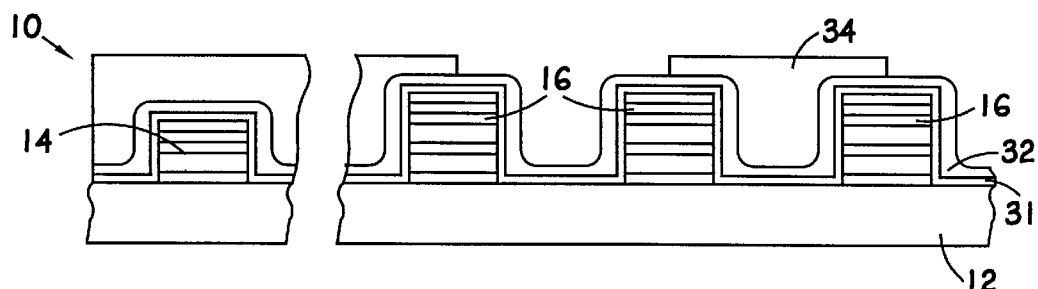
FIG. 2 is a cross sectional view of the flash memory structure in FIG. 1, with a layer of photo resist, used in the prior art.
Figure 6:
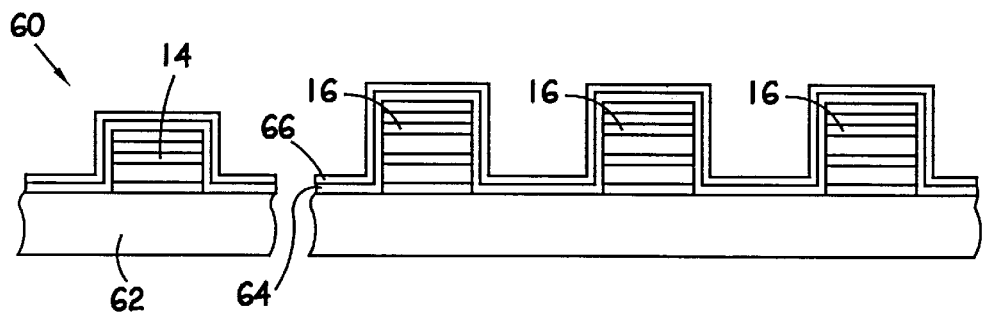
FIG. 6 is a cross sectional view of a flash memory structure of a preferred embodiment of the invention.

FIG. 6 is a cross sectional view of an incomplete flash memory structure 60. The flash memory structure 60 comprises a substrate 62, a plurality of core stacks 16 mounted on the substrate 62 in a row forming a word line, and a periphery stack 14 associated with the word line of the core stacks mounted on the substrate 62 spaced apart from the core stacks 16. The periphery stack 14 and core stacks 16 in this embodiment are the same stacks that are disclosed in FIG. 1. In this embodiment the periphery stack 14 and the core stacks 16 may be any conventional periphery and core stack combination used in flash memory.

Figure 7:
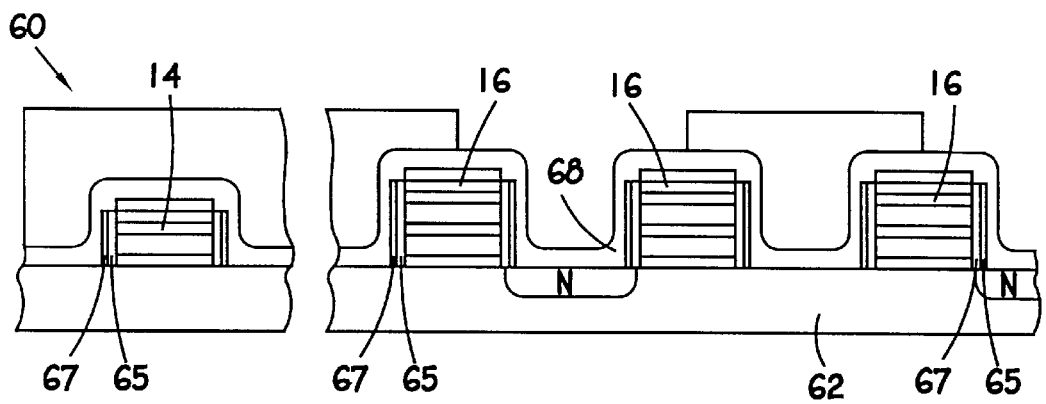
FIG. 7 is a cross sectional view of the flash memory structure in FIG. 6, with formed side walls.

An oxide layer 64 with a thickness of 20–150 Å is placed over the periphery stack 14, the core stacks, 16 and the uncovered surface of the substrate 62, as shown in FIG. 6. A protective layer 66 with a thickness of 50–300 Å is placed over the oxide layer 64. In the preferred embodiment the protective layer 66 is of an electrically insulative material from the group consisting of SiON, $Si_3N_4$ and a high K material. High K dielectric constant materials have a high dielectric constant (K), such as titanium dioxide ($TiO_2$), which has a dielectric constant (K) of 100–210, and tantalum oxide ($Ta_2O_5$), which has a dielectric constant (K) of 20–40. Materials with a high dielectric constant provide the advantage of higher electrical insulation. Therefore, the protective layer is of a material from the group consisting of SiON, $Si_3N_4$, and an insulative material with a K value of at least 20. More specifically the protective layer is of a material from the group consisting of SiON, $Si_3N_4$, $TiO_2$, and $Ta_2O_5$. The oxide layer 64 and the protective layer 66 are then etched back to form first protective side walls 65 from the oxide layer 64 and second protective side walls 67 from the protective layer 66, which surround the periphery stack 14 and the core stacks 16 and extend from the substrate 62 surface to a point below the tops of the stacks, as shown in FIG. 7. Other embodiments of the invention prefer that the first protective side walls 65 are less than 200 Å thick and the second protective side walls 67 are less than 350 Å thick. A first high temperature oxidation oxide (HTO) layer 68 is placed over the first protective side walls 65 and the second protective side walls 67 and the uncovered parts of the periphery and core stacks 14, 16 and substrate 62 surface. A first; resist mask 70 is placed over parts of the first HTO layer 68 to cover the periphery stack 14 and parts of the core stacks 16 and the drain area.

Figure 8:
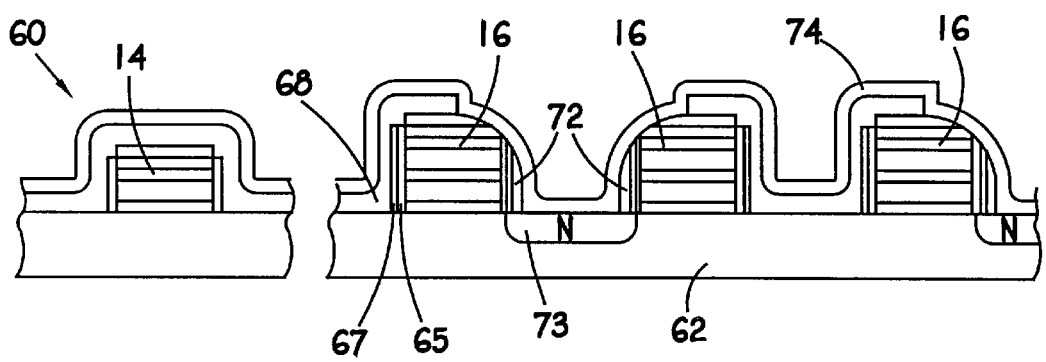
FIG. 8 is a cross sectional view of the flash memory structure in FIG. 7 with side spacers.

The parts of the first HTO layer 68 not covered by the first resist mask 70 are etched partially away to create self aligned source spacers 72, as shown in FIG. 8. The flash memory structure 60 is subjected to a deep source implant to form deep source regions 73 for the core stacks in the substrate 62. The first resist mask 70 is then stripped away and a second HTO layer 74 is placed over the first HTO layer 68, self aligned source spacers 72, and the uncovered parts of the core stacks 16 and substrate 62 surface.

Figure 9:
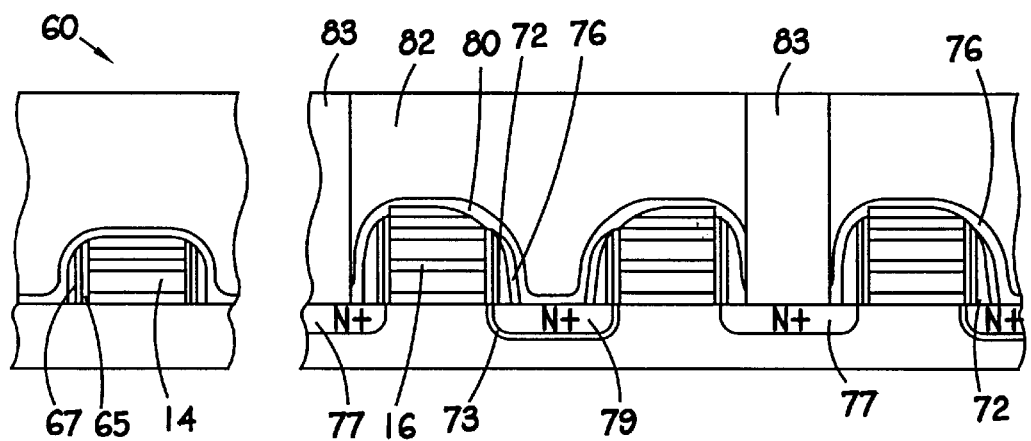
FIG. 9 is a cross sectional view of the flash memory structure of FIG. 8, with an intermetallic dielectric layer.

The second HTO layer 74 is etched away to form source/drain spacers 76, as shown in FIG. 9. The flash memory structure is subjected to a shallow dopant implant to create shallow more highly concentrated drain regions 77 and source regions 79. A third HTO layer 80 is placed over the self aligned source spacers 72, the source/drain spacers 76, and the uncovered parts of the core stacks 16, periphery stack 14 and substrate 62 surface. An intermetallic dielectric layer (IDL) 82 is placed over the third HTO layer 80. A trench is etched into the intermetallic dielectric layer (IDL) 82 and is filled to create a conductive plug 83, of an electrically conductive material such as tungsten, electrically connected to a drain region 77 of a core stack 16.

Conventional processes are then used to complete the flash memory structure 60.

The first protective side walls 65 and the second protective side walls 67 reduce current leakage between the tungsten plug 83 and the core stacks 16 and protect the core stacks 16 and periphery stack 14 during the fabrication process.

Figure 3:
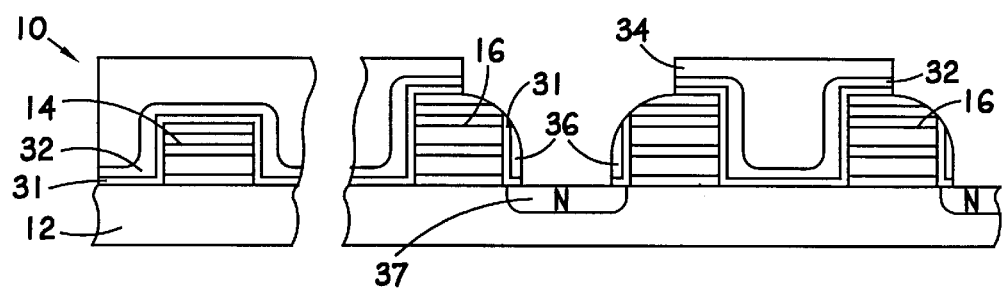
FIG. 3 is a cross sectional view of the flash memory structure in FIG. 2, with a partially etched HTO layer, used in the prior art.
Figure 4:
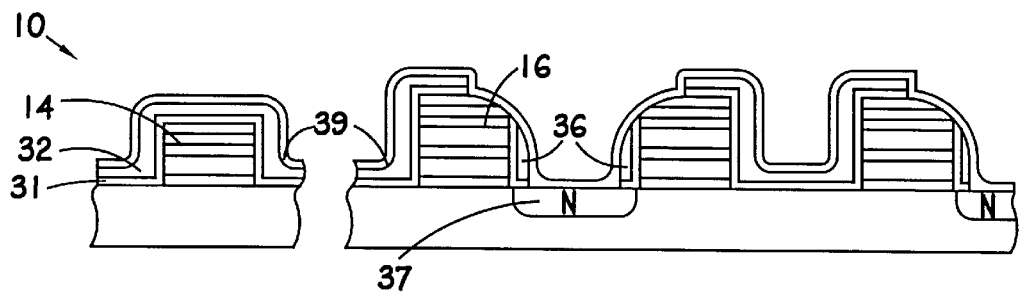
FIG. 4 is a cross sectional view of the flash memory structure in FIG. 3, with a second HTO layer, used in the prior art.
Figure 5:
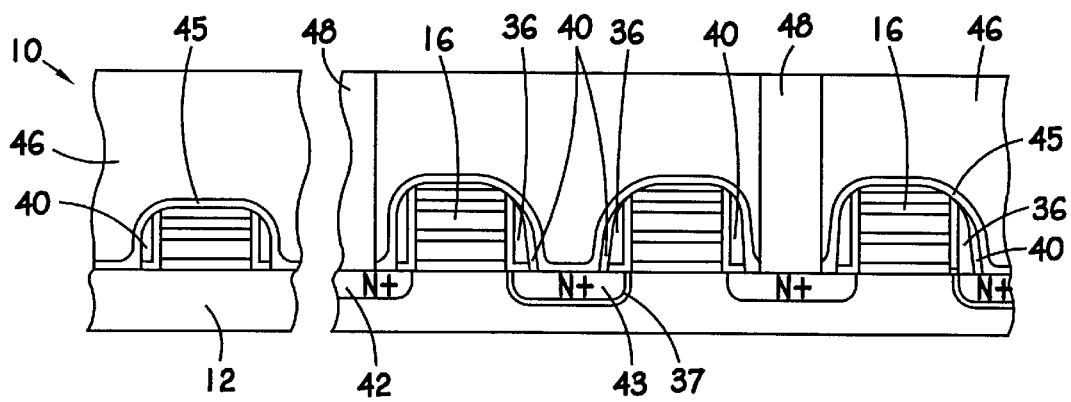
FIG. 5 is a cross sectional view of the flash memory structure in FIG. 4, with an intermetallic dielectric layer and tungsten plug, used in the prior art.

Because the oxide layer 64 and the protective layer 66 are applied as relatively thin layers before they are etched back, the resulting side walls 65, 67 have, and are defined as having, a fairly uniform thickness from the top of the side walls 65, 67 to the bottom of the side walls 65,67, since minimal etching is required to form the side walls 65, 67. This is in contrast to the prior art, which applies thick layers which are etched back to form side spacers. Larger amounts of etching are required to removed the desired parts, which causes the formation of side spacers, which are significantly thinner on the top than near the base adjacent to the substrate. An example of a thick layer and side spacers in the prior art is the first HTO layer 32 with a thickness of 1,000 Å, which is etched back to form the self aligned source spacers 36, as shown in FIG. 3.

Information as herein shown and described in detail is fully capable of attaining the above-described object of the invention, it is understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

We claim:

1. A flash memory device, comprising:
   a substrate with a surface;
   at least one periphery stack with sides and a top, wherein the periphery stack is on the substrate surface;
   a plurality of core stacks with sides and tops, wherein the core stacks are on the surface of the substrate;
   a plurality of first side walls, of a thickness less than 150 Å, surrounding the sides of the periphery stack and core stacks, extending from the substrate surface to a point below the tops of the stacks;
   a plurality of second side walls, of a thickness less than 300 Å, surrounding the first side walls, extending from the substrate surface to a point below the tops of the stacks;
   a plurality of spacers on the sides of the second side walls; and
   a protective HTO layer over the plurality of core stacks, the periphery stack, the spacers, and the substrate.

2. The flash memory device, as recited in claim 1, further comprising:
   an intermetallic dielectric layer over the HTO layer; and
   a conductive plug in the intermetallic dielectric layer.

3. The flash memory device, as recited in claim 2, further comprising source regions and drain regions adjacent to the plurality of core stacks, wherein the conductive plug is electrically connected to a drain region.

4. The flash memory device, as recited in claim 3, wherein the second side walls are of an electrically insulative material from the group consisting of silicon oxynitride (SiON), silicon nitride ($Si_3N_4$), and a high K material.

5. The flash memory device, as recited in claim 4, wherein the first side walls are of silicon oxide.

6. The flash memory device, as recited in claim 1, further comprising deep source regions surrounding the source regions of the core stacks, wherein the first and second side walls, the spacers, the source regions, the drain regions, and the deep source regions are formed by the steps comprising:
   forming a first protective layer of silicon oxide, of a thickness less than 200 Å, over the plurality of core stacks, the periphery stack, and the substrate;
   forming a second protective layer, of a thickness less than 350 Å, over the first protective layer;
   etching back the first protective layer and the second protective layer to form the plurality of first side walls and second side walls surrounding the core stacks and the periphery stack and extending from the substrate surface to a point below the top of the stacks;
   forming a first spacer HTO layer over the plurality of core stacks, the periphery stack, the side walls, and the uncovered parts of the substrate;
   covering part of the first spacer HTO layer with a resist layer;
   etching back parts of the first spacer HTO layer not covered by the resist layer to form self aligned source spacers of the plurality of spacers;
   subjecting the device to a deep source implant to form the deep source regions;
   removing the resist layer;
   covering uncovered parts of the first spacer HTO layer, the plurality of core stacks, the self aligned source spacers, and the substrate with a second spacer HTO layer;
   etching back parts of the first spacer HTO layer and second spacer HTO layer to form source/drain spacers of the plurality of spacers; and
   subjecting the device to a shallow dopant implant to form the source regions and drain regions.

7. The flash memory device, as recited in claim 6, wherein the second side walls are of an insulative material from a group consisting of silicon oxynitride (SiON), silicon nitride ($Si_3N_4$), and a high K material.

8. The flash memory device, as recited in claim 1, wherein the second side walls are of a material from the group consisting of silicon oxynitride (SiON), silicon nitride ($Si_3N_4$), titanium dioxide ($TiO_2$), and tantalum pentoxide ($Ta_2O_5$).

9. The flash memory device, as recited in claim 8, wherein the plurality of core stacks comprise:
   a tunnel oxide layer on the substrate;
   a first polysilicon layer on the tunnel oxide layer;
   an interpoly dielectric layer on the first polysilicon layer; and
   a second polysilicon layer on the tunnel oxide layer.

10. The flash memory device, as recited in claim 1, wherein the plurality of core stacks comprise:
    a tunnel oxide layer on the substrate;
    a first polysilicon layer on the tunnel oxide layer;
    an interpoly dielectric layer on the first polysilicon layer; and
    a second polysilicon layer on the tunnel oxide layer.

* * * * *